(12) United States Patent
Kuo

(10) Patent No.: US 6,727,748 B2
(45) Date of Patent: Apr. 27, 2004

(54) HIGHLY EFFICIENT CONSTANT TRANSCONDUCTANCE POWER AMPLIFIER

(75) Inventor: Wen-Kai Kuo, Hsinchu (TW)

(73) Assignee: Terax Communication Technologies Inc., Hsinchu (TW)

( * ) Notice: Subject to any disclaimer, the term of this patent is extended or adjusted under 35 U.S.C. 154(b) by 12 days.

(21) Appl. No.: 10/141,121

(22) Filed: May 9, 2002

(65) Prior Publication Data
US 2003/0210091 A1 Nov. 13, 2003

(51) Int. Cl.[7] ................................................ H03F 1/02
(52) U.S. Cl. ........................ 330/9; 330/207 A; 330/251
(58) Field of Search .......................... 330/9, 51, 207 A, 330/251

(56) References Cited

U.S. PATENT DOCUMENTS 6,420,932 B1 * 7/2002 Casper ........................ 330/258
6,483,383 B2 * 11/2002 Wu ............................. 330/253

* cited by examiner

Primary Examiner—Khanh Van Nguyen
(74) Attorney, Agent, or Firm—Rosenberg, Klein & Lee

(57) ABSTRACT

The present invention discloses a highly efficient constant transconductance power amplifier. an embodiment of the invention comprises a positive error amplifier, a negative error amplifier, four current sources, two differential current controllers, and a constant gm biasing circuit. The amplifiers are used with deliberate offset voltages in order to make two transconductance amplifiers which serve in the positive and negative cycle in order to turn on in the appropriate cycle properly. Positive current sources are current outputs while negative current sources sink the current. The current sources provide current to the current controllers. The differential current controllers control the amount of current from the current source flowing to the load. This is proportional to the differential input signal. The constant transconductance biasing circuit provides the transconductance amplifiers with stable biasing voltage. This eliminates any drift associated with process variation. The invention discloses a more efficient constant transconductance power amplifier which provides improved performance, low power consumption, lower operating voltage, increased dynamic range, and stable processing characteristics.

6 Claims, 3 Drawing Sheets

HIGHLY EFFICIENT CONSTANT TRANSCONDUCTANCE POWER AMPLIFIER

BACKGROUND OF THE INVENTION

1. Field of the Invention

The present invention relates to a power amplifier. More specifically, the present invention discloses a power amplifier with constant transconductance.

2. Description of the Prior Art

Power amplifiers are utilized in a wide variety of applications in current electronics technology. Low power consumption is especially important in portable devices.

Unfortunately, the bandwidth of conventional amplifiers must often be substantially reduced to maintain a stable frequency response. Also, there is a trade-off between linearity and power efficiency.

Additionally many analog and digital circuits are often included on the same die. This situation can result in system degradation in the form of power supply noise contamination of the analog signals unless there is sufficient rejection of this noise within the amplifiers in the circuit.

Therefore, there is a need for a more efficient constant transconductance power amplifier which provides improved performance, low power consumption, increased dynamic range, and stable processing characteristics.

SUMMARY OF THE INVENTION

To achieve these and other advantages and in order to overcome the disadvantages of the conventional devices in accordance with the purpose of the invention as embodied and broadly described herein, the present invention provides a highly efficient constant transconductance power amplifier with improved performance, low power consumption, increased dynamic range, and stable processing characteristics.

In semiconductor processing it is difficult to maintain consistency from batch to batch. This inconsistency is detrimental to the operational characteristics of the resulting circuitry.

By utilizing an external circuit, for example a resistor circuit, to control the biasing status or level, biasing is kept independent of semiconductor processing. Therefore, variations in processing do not affect circuit biasing thereby maintaining circuit stability.

Transconductances are a very important parameter that must be stabilized in circuits. Transistor transconductances are matched to the conductance of a resistor. Therefore, transistor transconductances are independent of power-supply voltage as well as process and temperature variations.

The present invention comprises a combination of transconductance and constant biasing technology to overcome the drifting problems associated with manufacturing processing. Utilization of the present invention allows these problems to be controlled to within a 10% tolerance range thereby increasing yield rates and lowering manufacturing costs.

An objective of the present invention is to maintain a constant and stable transconductance for stabilization. The transistor transconductances are selected to match the conductance of a resistor. Therefore, the transistor transconductances are independent of supply voltages as well as process and temperature variations.

The transconductance is determined by geometric ratios. It is independent of power supply voltages, semiconductor processing parameters and temperature characteristics. Therefore, the transconductance is not dependant or affected by any parameters with large variability.

Since transistor currents derive from the same biasing network and geometry determines the current rations, all transconductances are stabilized.

The invention combines the above constant transconductance amplifier and current switching technique to achieve the purpose of saving power consumption.

The basic elements of the constant transconductance power amplifier are an error amplifier, an error amplifier, a current source, a current source, a differential current controller, a differential current controller, a current source, a current source, and a constant gm biasing circuit.

The error amplifiers are used with deliberate offset voltages in order to make two transconductance amplifiers which serve in the positive and negative cycle in order to turn on in the appropriate cycle properly.

Positive current sources are current outputs while negative current sources sink the current. The current sources provide current to the current controllers.

The differential current controllers control the amount of current from the current source flowing to the load. This is proportional to the differential input signal.

The constant transconductance biasing circuit provides the transconductance amplifiers with stable biasing voltage. This eliminates any drift associated with process variation.

Providing the offset voltages into the two amplifiers, all transistors are turned off in the quiescent state. The current controllers try to equalize which produces a similar voltage therefore ratioing the currents.

An embodiment of the present invention also provides quiescent current control and reduces excess phase shift which may be introduced into the system by the amplifiers.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
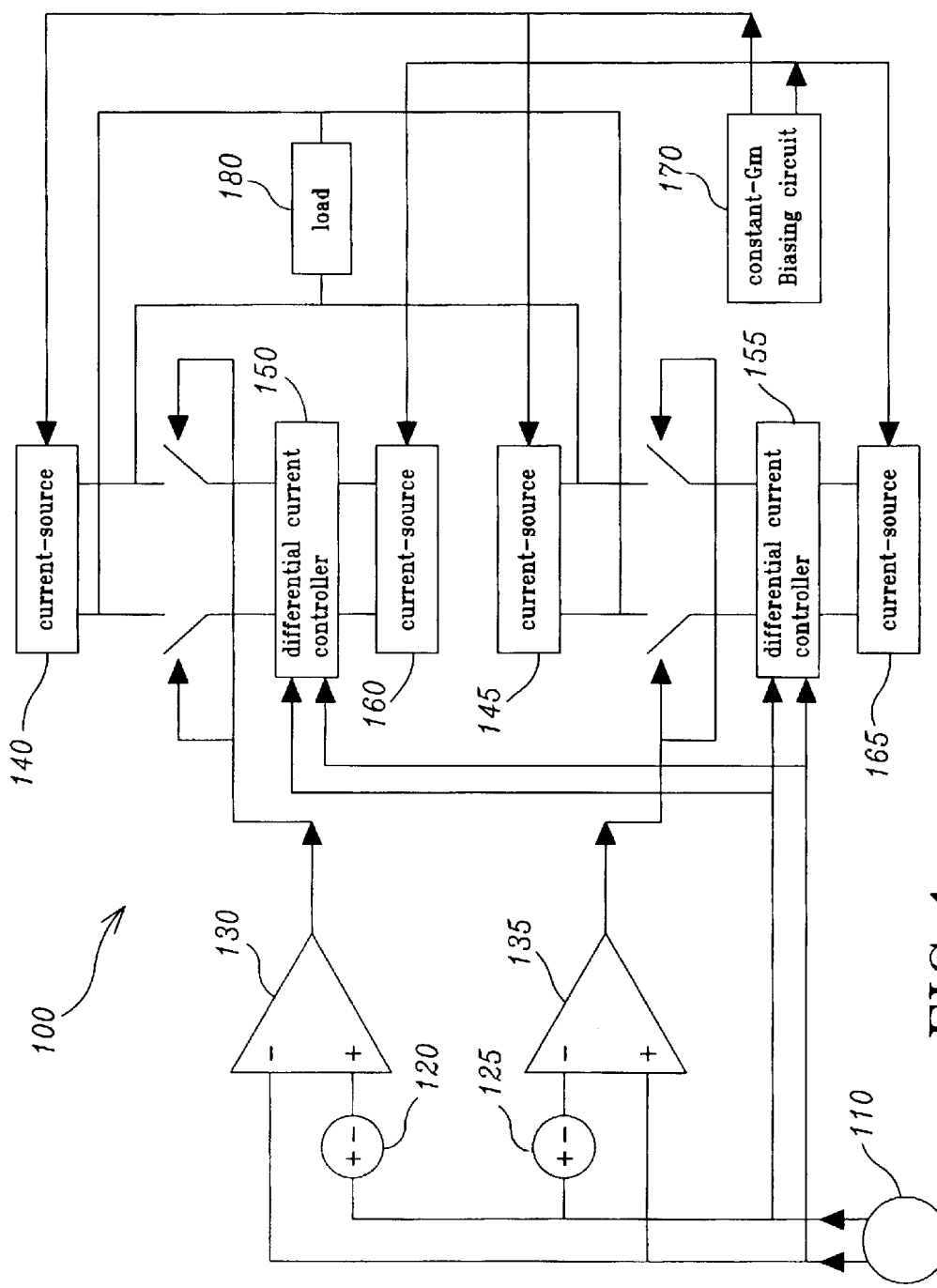
FIG. 1 is a block diagram illustrating a constant transconductance power amplifier according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

In semiconductor processing it is difficult to maintain consistency from batch to batch. This inconsistency is detrimental to the operational characteristics of the resulting circuitry.

By utilizing an external circuit, for example a resistor circuit, to control the biasing status or level, biasing is kept independent of semiconductor processing. Therefore, variations in processing do not affect circuit biasing thereby maintaining circuit stability.

Transconductances are a very important parameter that must be stabilized in circuits. Transistor transconductances are matched to the conductance of a resistor. Therefore, transistor transconductances are independent of power-supply voltage as well as process and temperature variations.

The present invention comprises a combination of transconductance and constant biasing technology to overcome the drifting problems associated with manufacturing processing. Utilization of the present invention allows these problems to be controlled to within a 10% tolerance range thereby increasing yield rates and lowering manufacturing costs.

An objective of the present invention is to maintain a constant and stable transconductance for stabilization. The transistor transconductances are selected to match the conductance of a resistor. Therefore, the transistor transconductances are independent of supply voltages as well as process and temperature variations.

In the invention, transconductance is mainly determined by geometric ratios. It is independent of power supply voltages, semiconductor processing parameters and temperature characteristics. Therefore, the transconductance is not dependant or affected by any parameters with large variability.

Since transistor currents derive from the same biasing network and geometry chiefly determines the current rations, all transconductances are stabilized.

Refer to FIG. 1 which is a block diagram illustrating a constant transconductance power amplifier according to an embodiment of the present invention.

The basic elements of the constant transconductance power amplifier 100 are an error amplifier 130, an error amplifier 135, a positive current source 140, a positive current source 145, a differential current controller 150, a differential current controller 155, a negative current source 160, a negative current source 165, and a constant gm biasing circuit 170.

A signal source 110 supplies power to a negative input of error amplifier 130 and a positive input of error amplifier 135. An offset voltage 120 is applied to a positive input of the error amplifier 130 and a negative input of error amplifier 135.

The signal source 110 is also connected to a differential current controller 150 and a differential current controller 155. A negative current source 160 is connected to the differential current controller 150 and a negative current source 165 is connected to the differential current controller 155.

A load 180 is connected to positive current source 140 and positive current source 145.

The output of error amplifier 130 enables connection between a positive current source 140 to differential current controller 150. Similarly, the output of error amplifier 135 enables connection between a positive current source 145 and differential current controller 155. Therefore, the differential current controller 150 and the differential current controller 155 are thus connected to the load 180 when enabled by the error amplifier 130 and error amplifier 135.

Positive current source 140, positive current source 145, negative current source 160, and negative current source 165, are connected to a constant gm biasing circuit 170.

The amplifiers are used with deliberate offset voltages in order to make two transconductance amplifiers which serve in the positive and negative cycle in order to turn on in the appropriate cycle properly.

Positive current sources 140 145 are current outputs while negative current sources 160 165 sink the current. The current sources provide current to the current controllers.

The differential current controllers control the amount of current from the current source flowing to the load. This is proportional to the differential input signal.

The constant transconductance biasing circuit provides the transconductance amplifiers with stable biasing voltage. This eliminates any drift associated with process variation.

Providing the offset voltages into the two amplifiers, transistors are turned off in the quiescent state. The current controllers try to equalize which produces a similar voltage therefore ratioing the currents.

In operation, when a positive going signal is applied to the input, the output of the amplifier 130 will go high once the input signal has surpassed the value of the offset voltage 120. Therefore, the connection is enabled between the differential current controller 150 and the current source 140. As a result, the output of the differential current controller 150 drives the load 180.

Likewise, when a negative going signal is applied to the input, the output of the amplifier 135 will go high once the input signal has surpassed the value of the offset voltage 125. Therefore, the connection is enabled between the differential current controller 155 and the current source 145. As a result, the output of the differential current controller 155 drives the load 180.

Therefore, by this current-switching mechanism there is no dc current flowing from the positive current source (140, 145) to the negative current source (160, 165) when there is no signal input. This improves the power efficiency and saves the power consumption.

In summary, for a typical sine wave input to the circuit from the input source 110, the output of the circuit is a corresponding sine wave but is reduced in both the positive and negative cycle by the amount of the offset voltages 120 and 125.

Figure 2:
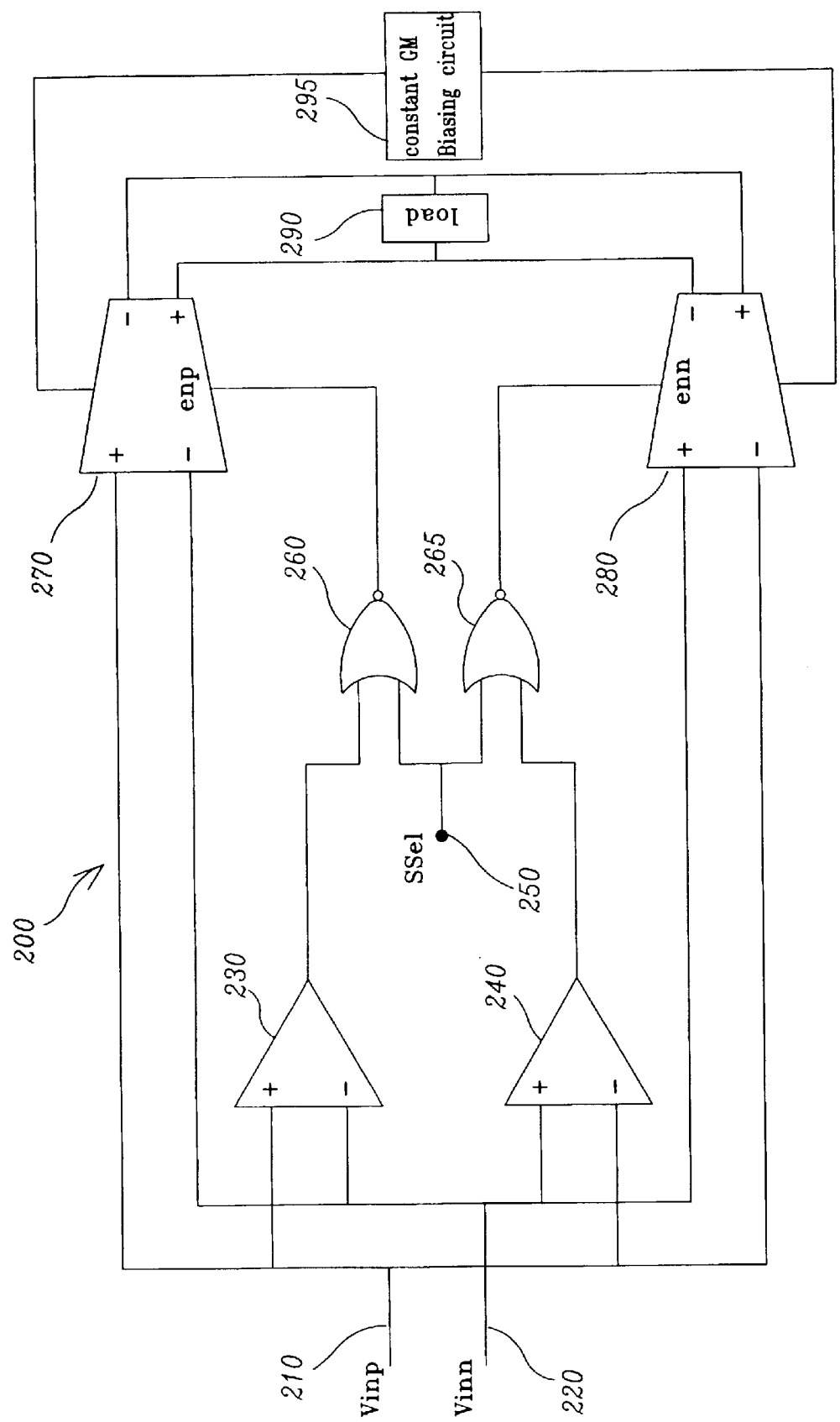
FIG. 2 is a circuit diagram of a single stage constant transconductance power amplifier according to an embodiment of the present invention.

Refer to FIG. 2, which is a circuit diagram of a single stage constant transconductance power amplifier according to an embodiment of the present invention.

The constant transconductance power amplifier 200 comprises two operational amplifiers 230 240. The inputs of both operational amplifiers 230 240 are connected to input source inputs 210 220. The output of operational amplifier 230 is connected to one input of a NOR gate 260. The output of operational amplifier 240 is connected to one input of a NOR gate 265. The other input of both NOR gates 260 265 are connected to a stage select enable 250. This stage select 250 is further utilized when implementing multiple stages of the invention. The output of NOR gate 260 is connected to an enable input of a voltage to current converter circuit 270. The inputs of the voltage to current converter circuit 270 are connected to the input source inputs 210 220.

The output of NOR gate 265 is connected to an enable input of a voltage to current converter circuit 280. The inputs of the voltage to current converter circuit 280 are connected to the input source inputs 210 220. A load is connected between the outputs of both voltage to current converter circuits 270 280.

Both voltage to current converter circuits 270 280 are stabilized and controlled by a constant transconductance biasing circuit 295.

The positive input of voltage to current converter circuit 270 is connected to the positive input source input 210 and the negative input of voltage to current converter circuit 270 is connected to the negative input source input 220. As a result, the converter circuit 270 drives the load 290 whenever a positive signal is applied to the input source input 210.

Likewise, the positive input of voltage to current converter circuit 280 is connected to the negative input source input 220 and the negative input of voltage to current converter circuit 280 is connected to the positive input source input 210. As a result, the converter circuit 280 drives the load 290 whenever a negative signal is applied to the input source input 220.

FIG. 2 shows a single stage implementation of the invention. However, in other embodiments of the present invention, multiple stages are added. Additional stages are selected by the stage select 250 or other enable methods.

Figure 3:
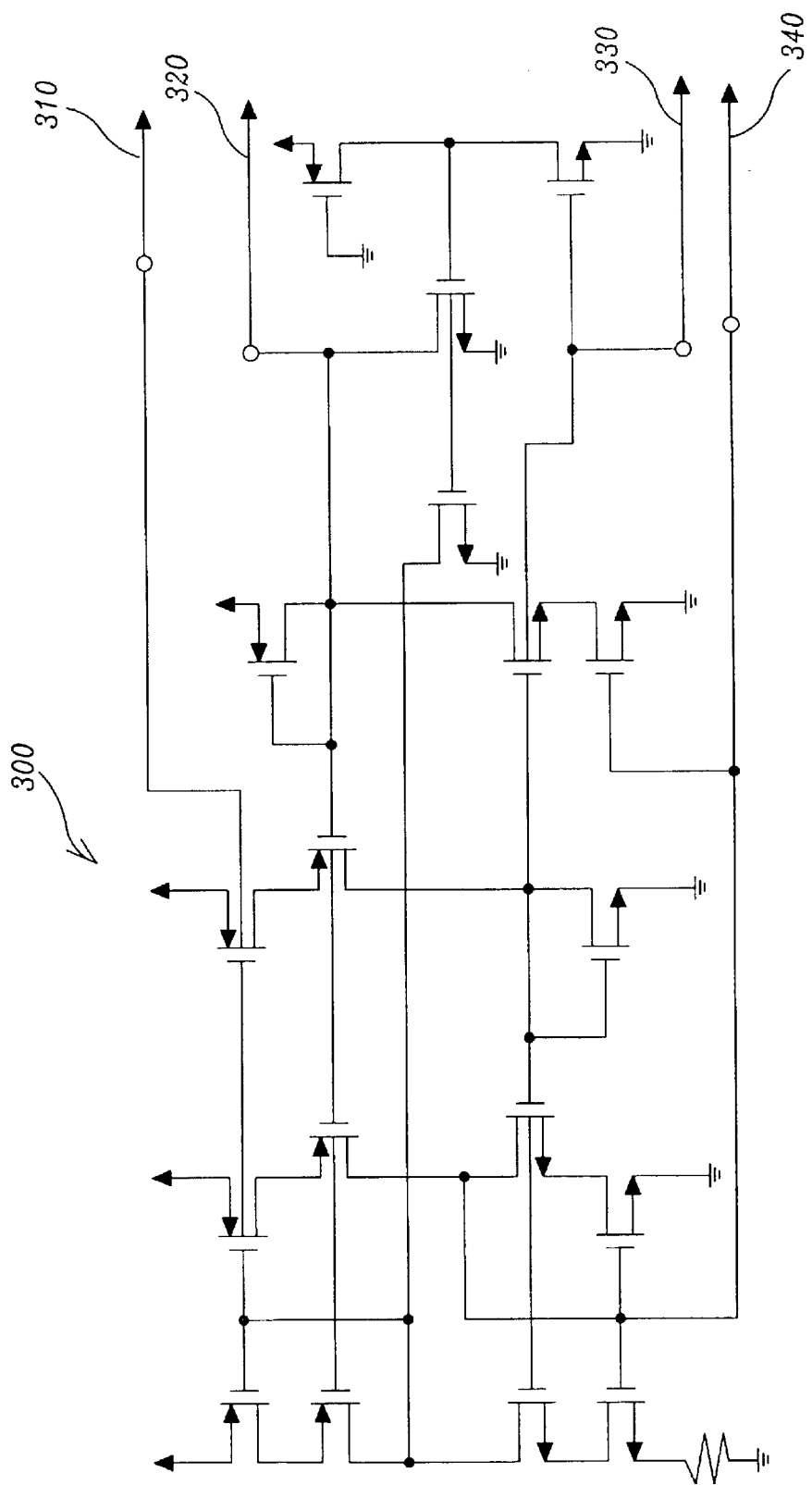
FIG. 3 is a circuit diagram of a constant transconductance circuit according to an embodiment of the present invention.

Refer to FIG. 3 which is a circuit diagram of a constant transconductance circuit according to an embodiment of the present invention.

The constant transconductance circuit 300 comprises wide-swing current mirrors and a start-up circuit. The outputs of the constant transconductance circuit 300 comprise can be utilized and implemented as requirements dictate. The outputs of the constant transconductance circuit 300 comprise a positive bias voltage output 310, a negative bias voltage output 340, a positive cascode voltage output 320, and a negative cascode voltage output 330. FIG. 3 shows one possible circuit for the constant transconductance circuit according to an embodiment of the present invention. Other embodiments of the present invention utilize other circuits, without deviating from the spirit of the invention, in order to provide a constant transconductance biasing circuit. Examples of implementation of the constant transconductance circuit 300 are shown in FIGS. 1 and 2. An embodiment of the present invention also provides quiescent current control and reduces excess phase shift which may be introduced into the system by the amplifiers.

In an embodiment of the present invention, the invention is practiced using CMOS technology. However, other embodiments of the present utilize other fabricating processes or technologies.

Therefore, the present invention provides a more efficient constant transconductance power amplifier which provides improved performance, low power consumption, lower operating voltage, increased dynamic range, and stable processing characteristics. An advantage of the present invention is that by utilizing a current output the dynamic range is increased. It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A highly efficient power amplifier with constant transconductance comprising:
   a positive error amplifier;
   a first offset voltage connected to a negative input of the positive error amplifier;
   a negative error amplifier;
   a second offset voltage connected to a positive input of the negative error amplifier;
   whereby a signal source is connected to a positive input of the positive error amplifier and a negative input of the negative error amplifier; and a constant transconductance biasing circuit;
   whereby the constant transconductance biasing circuit provides the positive error amplifier and the negative error amplifier with a stable biasing voltage.

2. The power amplifier of claim 1, whereby the power amplifier is a CMOS power amplifier.

3. A highly efficient constant transconductance power amplifier comprising:
   a first transconductance amplifier;
   a second transconductance amplifier;
   whereby a signal source is connected to a positive input of the second transconductance amplifier and a negative input of the first transconductance amplifier;
   a first current source;
   a third current source;
   whereby the first current source and the third current source are connected to a load;
   a first differential current controller;
   a second current source connected to the first differential current controller;
   a second differential current controller;
   a fourth current source connected to the second differential current controller; and
   a constant transconductance biasing circuit;
   whereby the constant transconductance biasing circuit is connected to the first, second, third, and fourth current sources;
   whereby an output of the second transconductance amplifier enables the second differential current controller to be connected to the load;
   whereby an output of the first transconductance amplifier enables the first differential current controller to be connected to the load;
   whereby no dc current flows from the first current source to the second current source when there is no signal input; and
   whereby no dc current flows from the third current source to the fourth current source when there is no signal input.

4. The power amplifier of claim 3, whereby the power amplifier is a CMOS power amplifier.

5. A highly efficient constant transconductance power amplifier comprising:
   a positive error amplifier;
   a first offset voltage connected to a negative input of the positive error amplifier;
   a negative error amplifier;
   a second offset voltage connected to a positive input of the negative error amplifier;
   whereby a signal source is connected to a positive input of the positive error amplifier and a negative input of the negative error amplifier;

a constant transconductance biasing circuit;

whereby the constant transconductance biasing circuit ensures a stable biasing voltage;

a first differential current controller;

a first current source;

a second current source connected to the first differential current controller;

a second differential current controller;

a third current source;

a fourth current source connected to the second differential current controller;

whereby the first current source, the second current source, the third current source, and the fourth current source are connected to the constant gm biasing circuit; and a load connected to the first current source and the third current source;

whereby an output of the positive error amplifier enables the second differential current controller to be connected to the load;

whereby an output of the negative error amplifier enables the first differential current controller to be connected to the load;

whereby no dc current flows from the first current source to the second current source when there is no signal input; and whereby no dc current flows from the third current source to the fourth current source when there is no signal input.

6. The power amplifier of claim 5, whereby the power amplifier is a CMOS power amplifier.

* * * * *